United States Patent
Wei et al.

(10) Patent No.: US 11,276,608 B2
(45) Date of Patent: Mar. 15, 2022

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Wang Wei, Shanghai (CN); Su Bo, Shanghai (CN); Hu You Cun, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/863,343

(22) Filed: Apr. 30, 2020

(65) Prior Publication Data
US 2021/0134659 A1 May 6, 2021

(30) Foreign Application Priority Data
Nov. 5, 2019 (CN) .......................... 201911072603.1

(51) Int. Cl.
*H01L 21/768* (2006.01)
*H01L 23/532* (2006.01)
*H01L 21/311* (2006.01)

(52) U.S. Cl.
CPC .. *H01L 21/76816* (2013.01); *H01L 21/31144* (2013.01); *H01L 21/76831* (2013.01); *H01L 21/76877* (2013.01); *H01L 23/5329* (2013.01)

(58) Field of Classification Search
CPC .......... H01L 21/76816; H01L 21/0337; H01L 21/31144; H01L 23/528; H01L 23/5226
See application file for complete search history.

(56) References Cited

U.S. PATENT DOCUMENTS 9,991,156 B2 * 6/2018 Burns ............... H01L 23/53266
10,998,193 B1 * 5/2021 Philip ............... H01L 21/30604
(Continued)

*Primary Examiner* — Zandra V Smith
*Assistant Examiner* — John M Parker
(74) *Attorney, Agent, or Firm* — Crowell & Moring LLP

(57) ABSTRACT

A semiconductor structure and a forming method thereof are provided. The forming method includes: providing a base, where a mask material layer is formed on the base, a plurality of first trenches disposed at intervals are formed in the mask material layer, an extension direction of the first trenches is a first direction, the plurality of first trenches are arranged in parallel along a second direction, and the second direction is perpendicular to the first direction; forming a first side wall covering layer and a barrier layer, where the first side wall covering layer is located on a side wall of the first trench, the barrier layer is located in at least one of the first trenches, the barrier layer divides the first trench in the first direction, and the first side wall covering layer exposes side walls of the barrier layer on two sides in the first direction; forming a second side wall covering layer on the side walls of the barrier layer exposed by the first side wall covering layer; and etching the mask material layer between the adjacent first trenches by using the first side wall covering layer, the second side wall covering layer and the barrier layer as a mask to form a second trench, where the second trench is isolated from the first trench by the first side wall covering layer. According to the present disclosure, the barrier layer is protected by the second side wall covering layer, thereby improving the accuracy of pattern transfer.

16 Claims, 7 Drawing Sheets

(56) References Cited

U.S. PATENT DOCUMENTS

| | | | |
|---|---|---|---|
| 2011/0104322 A1* | 5/2011 | Park | B82Y 10/00 |
| | | | 425/385 |
| 2020/0073235 A1* | 3/2020 | Park | G02B 5/3058 |
| 2020/0373161 A1* | 11/2020 | Wang | H01L 21/3086 |
| 2021/0082746 A1* | 3/2021 | Arnold | H01L 21/0332 |
| 2021/0090890 A1* | 3/2021 | Zhang | H01L 21/0337 |
| 2021/0249529 A1* | 8/2021 | Su | H01L 29/205 |

* cited by examiner

SEMICONDUCTOR STRUCTURE AND FORMING METHOD THEREOF

RELATED APPLICATIONS

The present application claims priority to Chinese Patent Appln. No. 201911072603.1, filed Nov. 5, 2019, the entire disclosure of which is hereby incorporated by reference.

BACKGROUND

Technical Field

Embodiments and implementations of the present disclosure relate to the field of semiconductor manufacturing, and in particular relates to a semiconductor structure and a forming method thereof.

Related Art

With the rapid growth of the semiconductor integrated circuit (IC) industry, semiconductor technology continues to develop toward smaller process nodes under the driving of Moore's Law, making the integrated circuits develop toward a direction of smaller size, higher circuit precision and higher circuit complexity.

In the development process of the integrated circuits, generally, as a functional density (i.e., the number of interconnect structures per chip) gradually increases, the geometric size (i.e., the smallest component size that can be produced using process steps) gradually decreases, which accordingly increases the manufacturing difficulty and complexity of the integrated circuits.

At present, under the condition that technology nodes are constantly shrinking, how to improve the accuracy of pattern transfer has become a challenge.

SUMMARY

The problem to be addressed in embodiments and implementations of the present disclosure is to provide a semiconductor structure and a forming method thereof to improve the accuracy of pattern transfer.

To address the foregoing problem, one form of the present disclosure provides a method for forming a semiconductor structure, including: providing a base, where a mask material layer is formed on the base, a plurality of first trenches is formed in the mask material layer, where the plurality of first trenches is disposed at intervals and penetrates the mask material layer, an extension direction of the first trenches is a first direction, the plurality of first trenches is arranged in parallel along a second direction, and the second direction is perpendicular to the first direction; forming a first side wall covering layer and a barrier layer, where the first side wall covering layer is located on a side wall of the first trench, the barrier layer is located in at least one first trench of the plurality of first trenches, the barrier layer divides the first trench in the first direction, and the first side wall covering layer exposes side walls of the barrier layer on two sides in the first direction; forming a second side wall covering layer on the side walls of the barrier layer exposed by the first side wall covering layer; and etching the mask material layer between the adjacent first trenches using the first side wall covering layer, the second side wall covering layer and the barrier layer as a mask to form a second trench penetrating the mask material layer in the mask material layer, where the second trench is isolated from the first trench by the first side wall covering layer.

Another form of the present disclosure further provide a semiconductor structure, including: a base; a mask material layer, located on the base; a plurality of first trenches disposed at intervals, where the first trenches penetrate the mask material layer, an extension direction of the first trenches is a first direction, the plurality of first trenches are arranged in parallel along a second direction, and the second direction is perpendicular to the first direction; a first side wall covering layer, located on a side wall of the first trench; a barrier layer, located in at least one first trench of the plurality of first trenches, where the barrier layer divides the first trench in the first direction; and a second side wall covering layer, located on surfaces of side walls of the barrier layer on two sides in the first direction.

Compared with the prior art, technical solutions of embodiments and implementations of the present disclosure have the following advantages:

In embodiments and implementations of the present disclosure, before etching the mask material layer between adjacent first trenches to form the second trench penetrating the mask material layer, the second side wall covering layer is formed on the side walls of the barrier layer exposed by the first side wall covering layer. The second side wall covering layer is configured to protect the side walls of the barrier layer to reduce the damage to the side walls of the barrier layer caused by the etching process used when forming the second trench, thereby reducing the influence on the size of the barrier layer along the first direction and on the appearance of the barrier layer. Therefore, when a pattern of the first trench is subsequently transferred into the base, it is beneficial to improve the accuracy of pattern transfer.

DETAILED DESCRIPTION

As can be known from the related art, as technology nodes are constantly becoming smaller, how to improve an accuracy of pattern transfer has become a challenge. The reasons why the accuracy of pattern transfer needs to be improved are now analyzed in combination with a forming method of a semiconductor structure.

Figure 1:
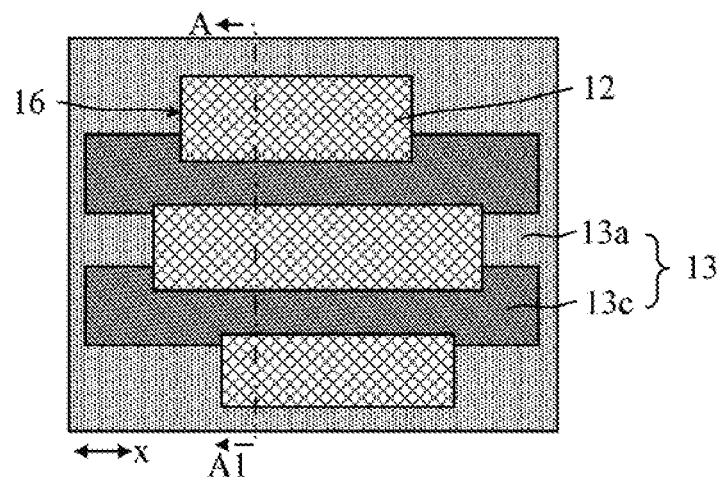
FIG. 1 to FIG. 3 are schematic structural diagrams corresponding to steps in a forming method of a semiconductor structure.
Figure 2:
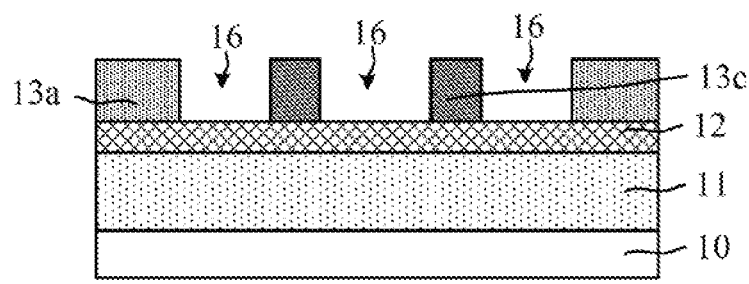
Figure 3:
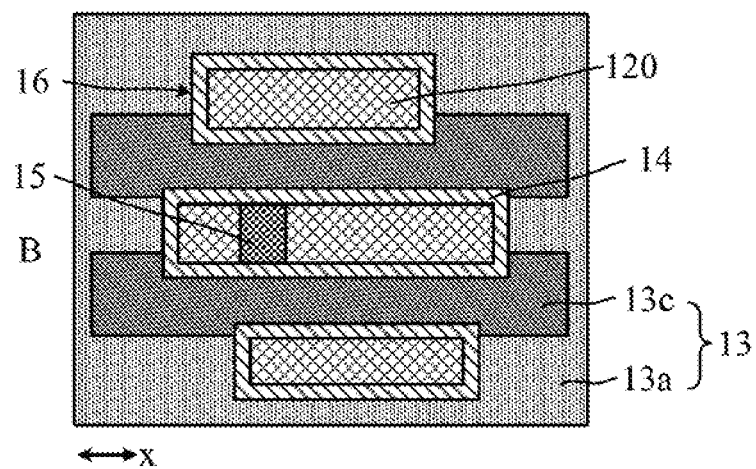

FIG. 1 to FIG. 3 illustrate schematic structural diagrams corresponding to steps in the forming method of a semiconductor structure.

With reference to FIG. 1 and FIG. 2 together, FIG. 1 is a top view, and FIG. 2 is a cross-sectional view of FIG. 1 taken along line AA1. A substrate 10 is provided. A dielectric layer 11, an etch stop layer 12 located on the dielectric layer 11, and a mask material layer 13 located on the etch stop layer 12 are formed on the substrate 10. The mask material layer 13 includes a doped mask layer 13a doped with ions and a sacrificial mask layer 13c not doped with ions. An extension direction of the sacrificial mask layer 13c is a first direction (shown as an x direction in FIG. 1). Etching resistance of the doped mask layer 13a is greater than etching resistance of the sacrificial mask layer 13c.

With continued reference to FIG. 1 and FIG. 2, first trenches 16 are formed in the mask material layer 13 on two sides of the sacrificial mask layer 13c, the first trenches 16 extend along the first direction (shown as the x direction in FIG. 1), and in the second direction (shown as a y direction in FIG. 1), projections of the first trench 16 and the sacrificial mask layer 13c on the base 10 are adjacent or partially overlap.

With reference to FIG. 3, FIG. 3 is a top view based on FIG. 1. A side wall covering layer 14 is formed on a side wall of the first trench 16. After the side wall covering layer 14 is formed, a barrier layer 15 is formed in at least one of the first trenches 16. The barrier layer 15 divides the first trench 16 in the first direction (shown as an x direction in FIG. 3), and the side wall covering layer 14 exposes side walls of the barrier layer 15 on two sides in the first direction.

The subsequent manufacturing processes further include: removing the sacrificial mask layer 13c by a wet etching process to form a second trench in the mask material layer 13. The etching resistance of the doped mask layer 13a is greater than the etching resistance of the sacrificial mask layer 13c, and therefore, after the sacrificial mask layer 13c is removed, the doped mask layer 13a is retained.

After the second trench is formed, the method further includes: etching the etch stop layer 12 and the dielectric layer 11 sequentially along the first trench 16 and the second trench by using the side wall covering layer 14 and the barrier layer 15 as a mask to form interconnection openings penetrating the dielectric layer 11.

The barrier layer 15 is used as a cut feature to cut a pattern of the first trench 16 corresponding to the inside of the dielectric layer 11 in the first direction, thereby forming the mutually isolated interconnection openings. However, when the wet etching process is adopted to remove the sacrificial mask layer 13c, the side walls of the barrier layer 15 on two sides in the first direction are exposed in an etching environment. The wet etching process has the characteristic of isotropic etching. The wet etching process is also easy for etching the side walls of the barrier layer 15, which not only influences the appearance of the barrier layer 15, but also causes the size of the barrier layer 15 along the first direction to become smaller, thereby causing a decrease in the accuracy of the pattern transfer.

To address the foregoing technical problems, one form of the present disclosure provides a forming method of a semiconductor structure, including: providing a base, where a mask material layer is formed on the base, a plurality of first trenches is formed in the mask material layer, where the first trenches are disposed at intervals and penetrate the mask material layer, an extension direction of the first trenches is a first direction, the plurality of first trenches are arranged in parallel along a second direction, and the second direction is perpendicular to the first direction; forming a first side wall covering layer and a barrier layer, where the first side wall covering layer is located on a side wall of the first trench, the barrier layer is located in at least one of the first trenches, the barrier layer divides the first trench in the first direction, and the first side wall covering layer exposes side walls of the barrier layer on two sides in the first direction; forming a second side wall covering layer on the side walls of the barrier layer exposed by the first side wall covering layer; and etching the mask material layer between the adjacent first trenches by using the first side wall covering layer, the second side wall covering layer and the barrier layer as a mask to form a second trench penetrating the mask material layer in the mask material layer, where the second trench is isolated from the first trench by the first side wall covering layer.

In order to make the foregoing objects, features and advantages of the embodiment of the present disclosure more comprehensible, embodiments and implementations of the present disclosure will be described in detail below in conjunction with the accompanying drawings.

FIG. 4 to FIG. 22 are schematic structural diagrams corresponding to steps in one form of a forming method of a semiconductor structure according to the present disclosure.

Figure 4:
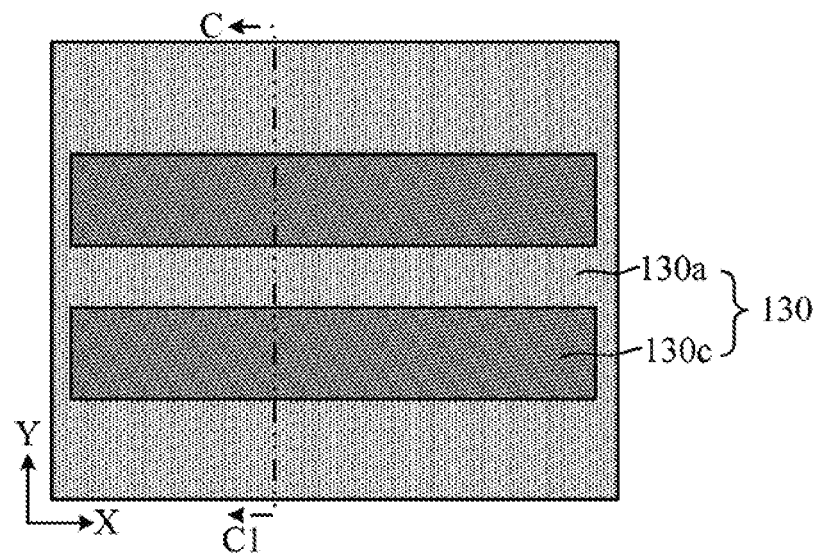
FIG. 4 to FIG. 22 are schematic structural diagrams corresponding to steps in one form of a forming method of a semiconductor structure according to the present disclosure.
Figure 5:
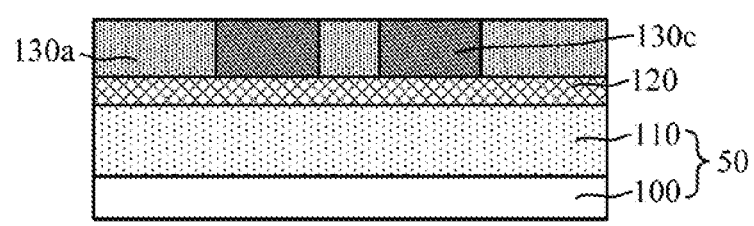
Figure 6:
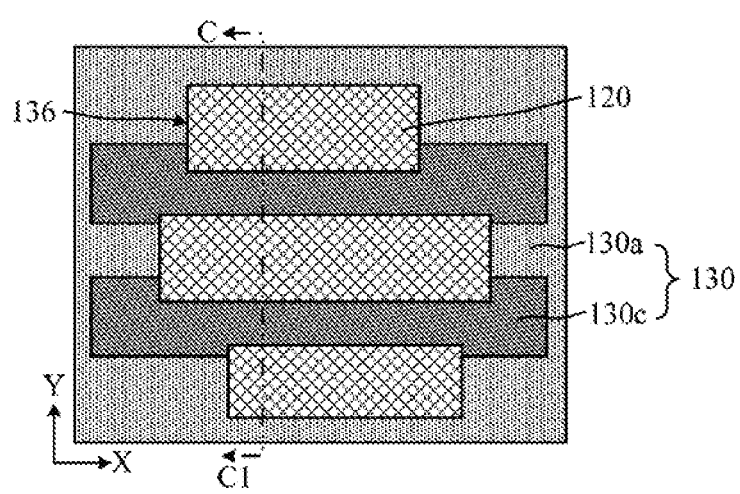

With reference to FIG. 4 to FIG. 7 together, a base 50 is provided. A mask material layer 130 is formed on the base 50, a plurality of first trenches 136 disposed at intervals and penetrating the mask material layer 130 are formed in the mask material layer 130 (as shown in FIG. 6), an extension direction of the first trench 136 is a first direction (shown as an X direction in FIG. 6), a direction perpendicular to the first direction is a second direction (shown as a Y direction in FIG. 6), and the plurality of first trenches 136 are arranged in parallel along the second direction.

The base 50 provides a process platform for subsequent manufacturing processes. In some implementations, application of the method of forming a semiconductor structure to a back end of line (BEOL) process of a semiconductor manufacturing process is taken as an example. As shown in FIG. 5, the base 50 includes a substrate 100 and a dielectric layer 110 located on the substrate 100. A plurality of conductive structures (not shown) are formed in the substrate 100.

The dielectric layer 110 is used for achieving electrical isolation between interconnection structures in the BEOL process. For example, the dielectric layer 110 may be a first metal interlayer dielectric layer, which is configure to achieve the electrical isolation between the first metal interconnection lines (i.e., M1 layer). The first metal interconnection lines refers to interconnection structures closest to the substrate 100.

Therefore, a material of the dielectric layer 110 is a low-k dielectric material (the low-k dielectric material refers to a dielectric material having a relative permittivity of greater than or equal to 2.6 and less than or equal to 3.9), an ultra-low-k dielectric material (the ultra-low-k dielectric material refers to a dielectric material having a relative permittivity of less than 2.6), silicon oxide, silicon nitride, silicon oxynitride or the like. In some implementations, the material of the dielectric layer 110 is the ultra-low-k dielectric material, thereby reducing a parasitic capacitance between the metal interconnection structures in the BEOL, and further reducing RC delay in the BEOL. Specifically, the ultra-low-k dielectric material may be SiOCH.

The mask material layer 130 is used as a mandrel layer, thereby providing a process basis for subsequent pattern transfer. In some implementations, the mask material layer 130 is amorphous silicon (a-Si). The amorphous silicon is a common mandrel layer material in the BEOL manufacturing process.

In order to reduce the damage to the base 50 caused by manufacturing processes before etching the base 50, an etch stop layer 120 is also formed between the base 50 and the mask material layer 130. Moreover, after the etch stop layer 120 is patterned subsequently, the remaining etch stop layer 120 can also be used as an etching mask when etching the base 50. In some implementations, the etch stop layer 120 is located between the dielectric layer 110 and the mask material layer 130.

A material of the etch stop layer 120 is different from a material of the mask material layer 130. In some implementations, the material of the etch stop layer 120 is a metal nitride such as TiN, AlN, TaN or the like.

With reference to FIG. 4 and FIG. 5 together, FIG. 4 is a top view, and FIG. 5 is a cross-sectional view of FIG. 4 taken along line CC1. After forming the mask material layer 130 and before forming the first trench 136, the forming method further includes: performing doping treatment on the mask material layer 130 in partial regions, which is suitable for increasing etching resistance of the mask material layer 130 subjected to the doping treatment.

The mask material layer 130 subjected to the doping treatment is used as a doped mask layer 130a, the mask material layer 130 not subjected to the doping treatment is used as a sacrificial mask layer 130c, an extension direction of the sacrificial mask layer 130c is a first direction (shown as an X direction in FIG. 4), and a direction perpendicular to the first direction is a second direction (shown as a Y direction in FIG. 4).

By doping impurity ions into the mask material layer 130 in partial regions, the microstructures in the materials of the doped mask layer 130a and the sacrificial mask layer 130c are different. In some implementations, the impurity ions reduce a grain boundary gap of silicon in the material of the doped mask layer 130a, thereby improving the thermal stability and chemical stability of the doped mask layer 130a. The improvement of the stability accordingly improves the etching resistance of the doped mask layer 130a.

The sacrificial mask layer 130c is configured to define a formation position of a second trench subsequently. The etching resistance of the doped mask layer 130a is greater than the etching resistance of the sacrificial mask layer 130c, and therefore, in the subsequent etching process of forming the second trench, the sacrificial mask layer 130c and the doped mask layer 130a have a larger etch selectivity, which significantly improves a process window for forming the second trench (for example, a maskless etching manner may be adopted to remove the sacrificial mask layer 130c) and ensures the pattern accuracy of the second trench.

In some implementations, the material of the mask material layer 130 is amorphous silicon, and therefore, the doping ions for the doping treatment are B ions. By doping the B ions into the amorphous silicon in partial regions, the material of the doped mask layer 130a becomes boron-doped silicon, thereby improving the etch selectivity between the sacrificial mask layer 130c and the doped mask layer 130a. Moreover, the B atoms have higher stability, so that the thermal stability and chemical stability of the doped mask layer 130a are ensured. Specifically, the step of the doping treatment includes: forming a first pattern layer (not shown) on the mask material layer 130 by a photolithography process or a self-aligned double patterning (SADP) process; performing doping treatment on the mask material layer 130 exposed by the first pattern layer by using an ion implantation process; and after the doping treatment, removing the first pattern layer. The ion implantation process is relatively simple, and by adjusting the implantation dose, the etch selectivity between the sacrificial mask layer 130c and the doped mask layer 130a can be easily adjusted.

Figure 7:
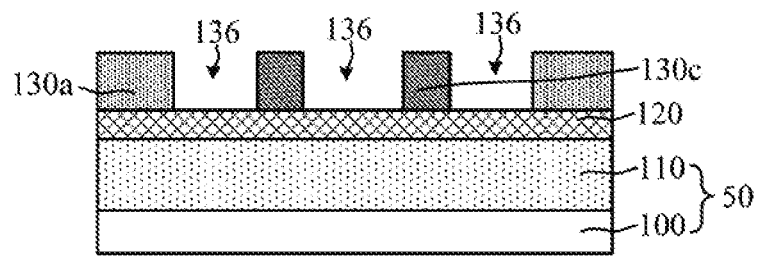

With reference to FIG. 6 and FIG. 7 together, FIG. 6 is a top view based on FIG. 4, and FIG. 7 is a cross-sectional view of FIG. 6 taken along line CC1. After the doping treatment, first trenches 136 are formed in the mask material layer 130 on two sides of the sacrificial mask layer 130c in the second direction (shown as the Y direction in FIG. 6), and side walls of the first trenches 136 expose the sacrificial mask layer 130c.

Specifically, after the doping treatment, the first trenches 136 are formed in the doped mask layer 130a on two sides of the sacrificial mask layer 130c in the second direction. The first trench 136 is configured to define a region to be etched in the base 50. Specifically, the first trench 136 is configured to define positions, shapes and sizes of part of interconnection openings subsequently formed in the dielectric layer 110. Before forming the first trench 136, the mask material layer 130 has not been patterned, so that a flat surface for forming the first trench 136 is provided, the complexity of the process of forming the first trench 136 is accordingly reduced, and the side wall of the first trench 136 has good appearance.

Specifically, the step of forming the first trench 136 includes: forming a second pattern layer (not shown) on the mask material layer 130, where a pattern opening (not shown) is formed in the second pattern layer, and the pattern opening exposes the mask material layer 130 on two sides of the sacrificial mask layer 130c in the second direction; etching the mask material layer 130 exposed by the pattern opening to form the first trench 136 in the mask material layer 130; and removing the second pattern layer.

In some implementations, in the second direction, the pattern opening is located on two sides of the sacrificial mask layer 130c, and projections of the pattern opening and the sacrificial mask layer 130c on the base 50 partially overlap, thereby reducing a distance between the first trench 136 and the second trench adjacent to each other, and satisfying the design complexity requirements of the integrated circuit. Accordingly, in the second direction, a projection of the pattern opening on the mask material layer 130 is located at the junction of the sacrificial mask layer 130c and the doped mask layer 130a. In other implementations, according to the design requirements of the integrated circuit, in the second direction, the side wall of the pattern opening facing the sacrificial mask layer may also be flush with a boundary of the adjacent sacrificial mask layer.

In some implementations, an anisotropic dry etching process is adopted to etch the mask material layer 130 exposed by the pattern opening. The anisotropic dry etching process is beneficial to improve the appearance quality of the first trench 136. Moreover, by adopting the anisotropic dry etching process, it is easy to control an etch stop position, thereby reducing the damage to the base 50. In addition, by reasonably adjusting parameters of the dry etching process, it is easy to etch the sacrificial mask layer 130c and the doped mask layer 130a at the same time. Specifically, by using a top surface of the etch stop layer 120 (as shown in FIG. 5) as the stop position, the mask material layer 130 is etched.

In some implementations, the extension direction of the first trench 136 is the same as the extension direction of the sacrificial mask layer 130c.

Figure 8:
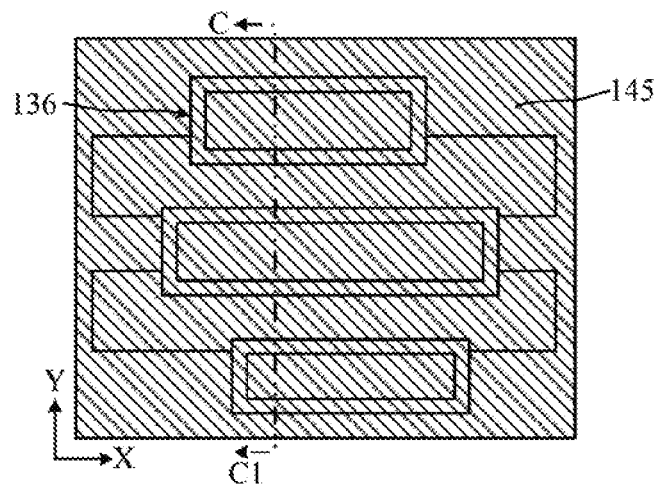
Figure 9:
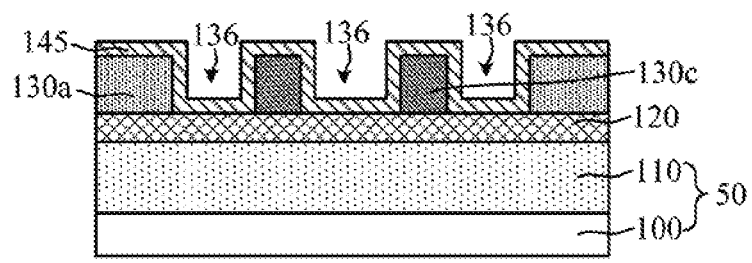
Figure 10:
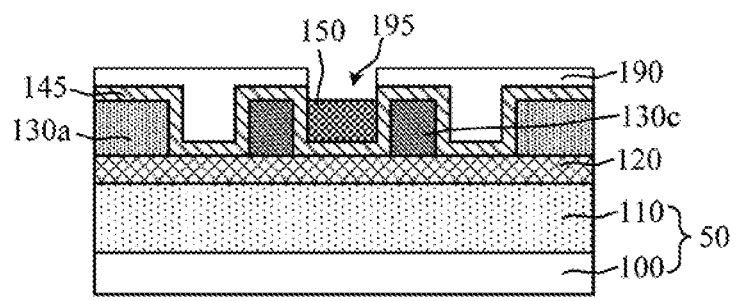
Figure 11:
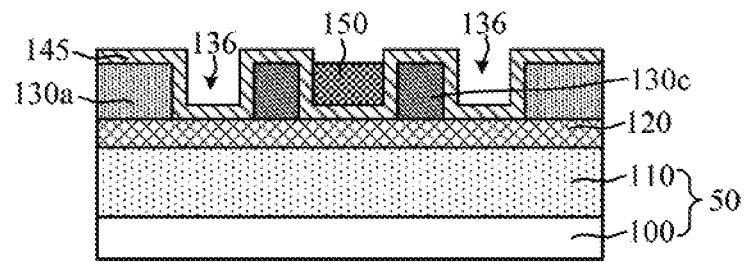
Figure 12:
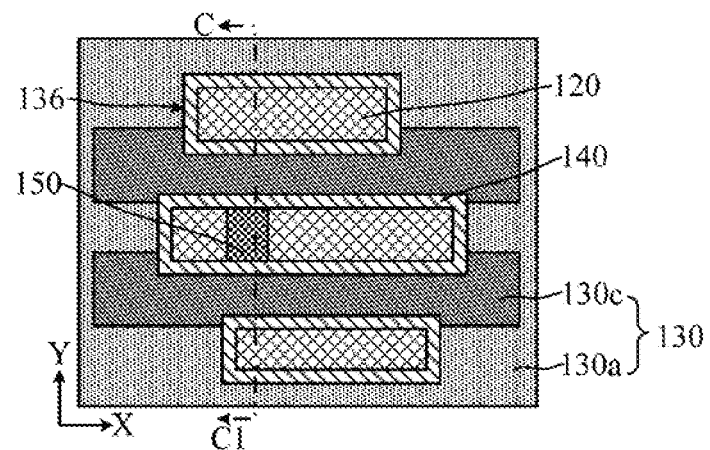

With reference to FIG. 8 to FIG. 13 together, a first side wall covering layer 140 (as shown in FIG. 9) and a barrier layer 150 (as shown in FIG. 12) are formed. The first side wall covering layer 140 is located the side wall of the first trench 136, the barrier layer 150 is located in at least one of the first trenches 136, the barrier layer 150 divides the first trench 136 in the first direction (shown as an X direction in FIG. 12), and the first side wall covering layer 140 exposes side walls of the barrier layer 150 on two sides in the first direction.

The first side wall covering layer 140 and the barrier layer 150 are used as a mask for etching the base 50. The subsequent manufacturing process further includes: etching the mask material layer 130 between the adjacent first trenches 136 to form the second trench penetrating the mask material layer in the mask material layer. The second trench is also configured to define a region to be etched in the base.

The step of forming the first side wall covering layer 140 and the barrier layer 150 will be described in detail below in conjunction with the accompanying drawings.

With reference to FIG. 8 to FIG. 9 together, FIG. 8 is a top view based on FIG. 6, and FIG. 9 is a cross-sectional view of FIG. 8 taken along line CC1. A first side wall covering material layer 145 is formed on the side wall and a bottom of the first trench 136 and a top of the mask material layer 130.

The first side wall covering material layer 145 is configured for preparation for subsequent formation of the first side wall covering layer. Subsequently, the mask material layer 130 between the adjacent first trenches 136 are etched to form the second trench, and the second trench is isolated from the first trench 136 through the first side wall covering layer, so that the problem of communication between the second trench and the first trench 136 is avoided and a distance between the second trench and the first trench 136 adjacent to each other can satisfy the designed minimum space. Therefore, the first side wall covering material layer 145 is made of a material different from that of the mask material layer 130, and thus functions as an etching mask. In some implementations, a material of the first side wall covering material layer 145 is a metal oxide. The metal oxide has higher etching resistance, and has a higher etch selectivity with the mask material layer 130. Specifically, the metal oxide includes one or more of titanium oxide, tantalum oxide, tungsten oxide, cobalt oxide, chromium oxide, vanadium oxide, cadmium oxide, hafnium oxide, indium oxide, iron oxide, aluminum oxide, zirconium oxide, zinc oxide and nickel oxide.

In some implementations, a deposition process is adopted to form the first side wall covering material layer 145. Specifically, an atomic layer deposition process is adopted to form the first side wall covering material layer 145. The first side wall covering material layer 145 formed by adopting the atomic layer deposition process has good thickness uniformity, and the first side wall covering material layer 145 has good step coverage, so that the first side wall covering material layer 145 can well cover corners at the bottom of the first trench 136.

It should be noted that a thickness of the first side wall covering material layer 145 should not be too small or too large. If the thickness is too small, the probability of damage to the side wall of the barrier layer 150 in the subsequent etching process is high. Accordingly, during the subsequent formation of the second trench, the probability of damage to the side wall of the first side wall covering layer is still high, which makes it difficult for the first side wall covering layer to function as an etching mask. If the thickness is too large, the remaining space of the first trench 136 may be too small accordingly, which easily results in that a width of the interconnection opening corresponding to the first trench 136 is too small, so the process limitations are great. Therefore, in some implementations, the thickness of the first side wall covering material layer 145 is 100 Å to 300 Å, for example, 150 Å, 200 Å or 250 Å.

With reference to FIG. 10 to FIG. 11 together, after the first side wall covering material layer 145 is formed, the barrier layer 150 is formed in at least one of the first trenches 136 (as shown in FIG. 11). Side walls of the barrier layer 150 on two sides in the second direction (shown as a Y direction in FIG. 8) and a bottom surface of the barrier layer 150 are respectively in contact with the first side wall covering material layer 145.

The side walls of the barrier layer 150 on the two sides in the second direction and the bottom surface of the barrier layer 150 are respectively in contact with the first side wall covering material layer 145, and therefore, the barrier layer 150 is configured to cut the first trench 136 in the first direction (shown as the X direction in FIG. 6). That is, the barrier layer 150 is used as a cut feature of the first trench 136. When a pattern of the first trench 136 is transferred into the base 50 subsequently, the barrier layer 150 functions as an etching mask, so that isolated patterns can be formed in the base 50. Compared with the solution of cutting the first trench in its extension direction by a photolithography process, the present implementation is beneficial to enlarge the process window for forming the first trench 136, thereby improving the accuracy of pattern transfer.

Specifically, the step of forming the barrier layer 150 includes: as shown in FIG. 10, forming a filling layer 190 on the mask material layer 130 and the first side wall covering material layer 145, where the filling layer 190 is also filled into the first trench 136; forming a through slot (not shown) in the filling layer 190, where the through slot divides the filling layer 190 in the first trench 136 in the first direction, and the through slot also extends onto the mask material layer 145 along the second direction; forming a barrier material layer (not shown) in the through slot, where the barrier material layer also covers a top surface of the filling layer 190; etching back the barrier material layer, and retaining the barrier material layer in the through slot as the barrier layer 150; and as shown in FIG. 11, after the barrier material layer is etched back, removing the filling layer 190.

The filling layer 190 is configured to provide a process platform for the formation of the barrier layer 150. A material of the filling layer 190 is a material that is easy to remove, and the process of removing the filling layer 190 has little damage to the mask material layer 130 and the base 50. In some implementations, the material of the filling layer 190 is a spin on carbon (SOC) material. In other implementations, the material of the filling layer may also be an organic dielectric layer (ODL) material or a bottom anti-reflective coating (BARC) material.

In some implementations, the barrier material layer is etched back by a dry etching process.

It should be noted that the barrier layer 150 is formed in the through slot, and therefore, by reasonably setting a thickness of the filling layer 190 and an etching amount of the barrier material layer, it is easy to make a height of the barrier layer 150 satisfy the process requirements, and the process flexibility is higher.

In some implementations, a material of the barrier layer 150 is silicon oxide. In other implementations, the material of the barrier layer may also be a low temperature oxide (LTO), titanium oxide or silicon oxycarbide.

In some implementations, an atomic layer deposition process is adopted to form the barrier material layer to improve the quality of the barrier layer material layer. In other implementations, according to the material of the barrier layer, a low pressure chemical vapor deposition process (LPCVD) may also be adopted to form the barrier layer.

It should be noted that a width of the barrier layer 150 in the first direction should not be too small or too large. If the width of the barrier layer 150 in the first direction is too small, it is easy to increase the difficulty of the process of forming the through slot, and even the through slots in partial regions cannot be formed normally. If the width of the barrier layer 150 in the first direction is large, during the formation of the barrier layer 150, the problem of early sealing at a top of the through slot is prone to occur, thereby causing void defects in the barrier layer 150. Therefore, in some implementations, the width of the barrier layer 150 in the first direction is 20 nm to 40 nm, for example, 22 nm.

The width of the barrier layer 150 in the first direction is limited by a forming process of the barrier material layer. As in some implementations, the process of forming the barrier material layer is an atomic layer deposition process. In this case, the barrier material layers deposited on side walls of the through slot on two sides in the first direction contact each other such that the through slot is fully filled. Therefore, the width of the barrier layer 150 in the first direction will not be too large, and the width of the barrier layer 150 itself in the first direction is limited. Thus, it is necessary to form a second side wall covering layer to enhance the protection for the barrier layer 150 subsequently.

It should also be noted that the first side wall covering layer 140 is formed on the side wall of the first trench 136, so in the second direction, even if the through slot exposes the first side wall covering layer 140 on the side wall of the corresponding first trench 136, a formation position of the barrier layer 150 still meets the process requirements. That is, the formation of the through slot has a large process window, for example, it can alleviate the limit of the resolution of the photolithography process.

Figure 13:
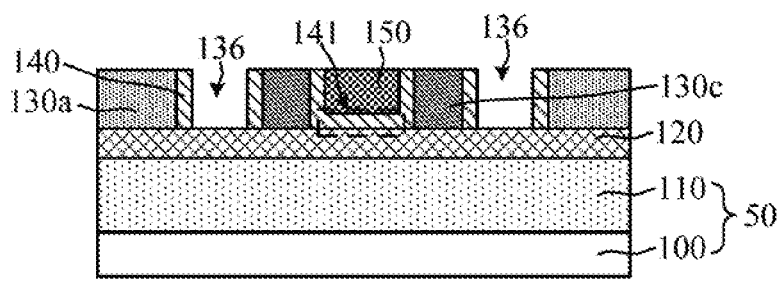

With reference to FIG. 12 to FIG. 13 together, FIG. 12 is a top view, and FIG. 13 is a cross-sectional view of FIG. 12 taken along line CC1. The first side wall covering material layer 145 is etched back until a top surface of the mask material layer 130 and a bottom surface of the first trench 136 are exposed so as to form the first side wall covering 140.

After the first side wall covering material layer 145 is etched back until the top surface of the mask material layer 130 and the bottom surface of the first trench 136 are exposed, the first side wall covering material layer 145 on the side wall of the first trench 136 is retained, and the bottom surface of the first trench 136 is exposed, thereby preparing for the subsequent transfer of the pattern in the first trench 136 into the base 50.

In some implementations, a maskless etching process is adopted to etch back the first side wall covering material layer 145. Specifically, the maskless etching process is anisotropic dry etching. By adopting the anisotropic dry etching, the first side wall covering material layer 145 on the bottom of the first trench 136 and the top of the mask material layer 130 can be removed along a direction perpendicular to a surface of the base 50, and the first side wall covering material layer 145 on the side wall of the first trench 136 can be retained. Moreover, by adopting the maskless etching process, a width range of the first side wall covering material layer 145 is not influenced by the photolithography process. Therefore, a width of the first side wall covering layer 140 can be made very small, so that the distance between the second trench and the first trench 136 adjacent to each other satisfies the designed minimum space, and the first side wall covering layer 140 still has good position precision and appearance precision, thereby avoiding the problem of alignment errors caused by the existing photolithography process.

It should be noted that after the barrier layer 150 is formed, the side wall covering material layer 145 on the bottom of the first trench 136 and the top of the mask material layer 130 is removed, thereby avoiding damage to the mask material layer 130 or the etch stop layer 120 caused by the manufacturing process of forming the barrier layer 150, and further avoiding influencing the accuracy of pattern transfer. Accordingly, under the action of the barrier layer 150, in the step of etching back the first side wall covering material layer 145 until the top surface of the mask material layer 130 and the bottom surface of the first trench 136 are exposed, the first side wall covering material layer 145 on the bottom of the barrier layer 150 is retained as a bottom remaining layer 141.

In some implementations, the thickness of the first side wall covering material layer 145 is 100 Å to 300 Å, and therefore, the width of the first side wall covering layer 140 is 100 Å to 300 Å. The width of the first side wall covering layer 140 refers to a size of the first side wall covering layer 140 in a direction perpendicular to the side wall of the first trench 136.

Figure 14:
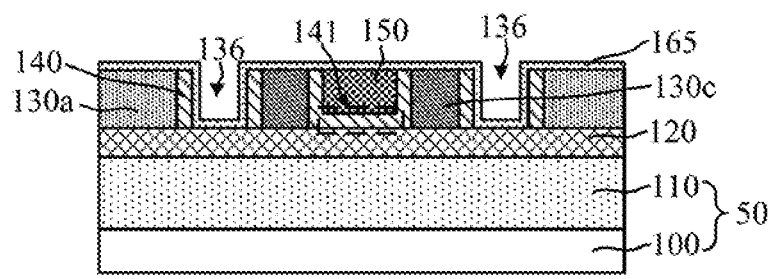
Figure 15:
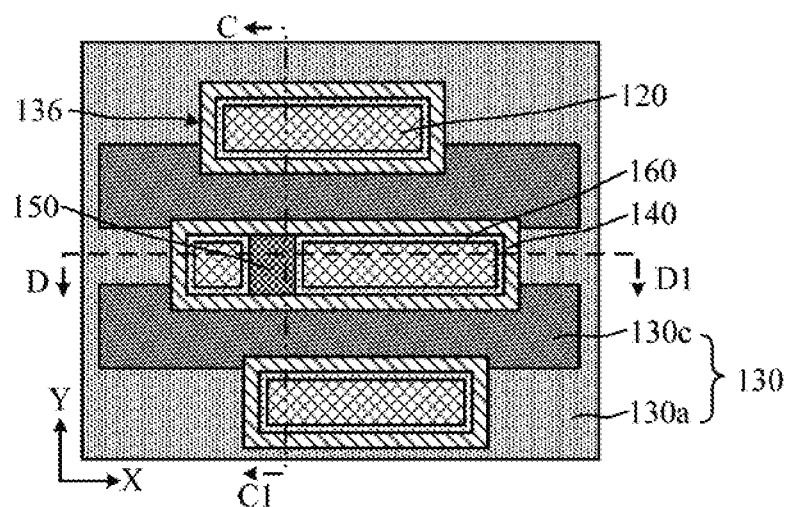

With reference to FIG. 14 to FIG. 17 together, after the first side wall covering layer 140 is formed, a second side wall covering layer 160 is formed on the side wall of the barrier layer 150 exposed by the first side wall covering layer 140 (as shown in FIG. 15).

The subsequent manufacturing process further includes: etching the mask material layer 130 between the adjacent first trenches 136 to form the second trench. The second side wall covering layer 160 is configured to protect the side wall of the barrier layer 150 to reduce the damage to the side wall of the barrier layer 150 caused by the etching process adopted to form the second trench. Therefore, when the pattern of the first trench 136 is transferred into the base 50 subsequently, it is beneficial to improve the accuracy of pattern transfer. Moreover, when the mask material layer 130 between the adjacent first trenches 136 is etched, the second side wall covering layer 160 may also function as an etching mask.

Therefore, a material of the second side wall covering layer 160 is different from the material of the mask material layer 130. The material of the second side wall covering layer 160 may be silicon nitride, silicon oxide, silicon oxynitride or silicon carbide. The amorphous silicon has a higher etch selectivity with the above materials.

In some implementations, the material of the second side wall covering layer 160 is different from a material of the first side wall covering layer 140. According to the process requirements, when the pattern in the first trench 136 is transferred into the base 50 subsequently, the first side wall covering layer 140 and the second side wall covering layer 160 in part of the first trenches 136 are jointly used as a mask, and the first side wall covering layer 140 in part of the first trenches 136 is independently used as a mask. That is, before the pattern in the first trench 136 is transferred into the base 50, for the first trench without a barrier layer, a step of removing the second side wall covering layer 160 in the first trench 136 may further be included. Therefore, by making the material of the second side wall covering layer 160 different from the material of the first side wall covering layer 140, the process flexibility is improved, thereby facilitating the removal of the second side wall covering layer 160 in part of the first trenches 136. For example, when a size of the interconnection opening corresponding to the first trench 136 is smaller in the second direction, the second side wall covering layer 160 in the first trench 136 is retained. When the size of the interconnection opening corresponding to the first trench 136 is larger along the second direction, then for the first trench without a barrier layer, the second side wall covering layer 160 in the first trench 136 is removed.

It should be noted that when the second side wall covering layer 160 in part of the first trenches 136 is removed, only the second side wall covering layer 160 in the first trench 136 in which no barrier layer 150 is formed is removed, so that the second side wall covering layer 160 has a protective effect on the barrier layer 150.

In some implementations, the material of the first side wall covering layer 140 is a metal oxide, and the material of the second side wall covering layer 160 is silicon nitride. The metal oxide and the silicon nitride have a higher etch selectivity. In other implementations, when it is not necessary to remove the second side wall covering layer subsequently, the materials of the first side wall covering layer and the second side wall covering layer may also be the same.

It should be noted that a width of the second side wall covering layer 160 should not be too small or too large. If the width is too small, the probability of damage to the side wall of the barrier layer 150 is higher when the second trench is formed subsequently. If the width is too large, the remaining space of the first trench 136 will be too small accordingly. When the first side wall covering layer 140 and the second side wall covering layer 160 in the first trench 136 are jointly used as the mask, it is easy to cause the width of the interconnection opening corresponding to the first trench 136 to be too small, so the process limitations are great. Therefore, in some implementations, the width of the second side wall covering layer 160 is 50 Å to 1000 Å, for example, 100 Å, 400 Å, 500 Å or 600 Å. The width of the second side wall covering layer 160 refers to a size of the second side wall covering layer 160 in a direction perpendicular to the side wall of the first trench 136.

Specifically, the step of forming the second side wall covering layer 160 includes that:

With reference to FIG. 14, FIG. 14 is a cross-sectional view based on FIG. 13. A second side wall covering material layer 165 is formed. The second side wall covering material layer 165 conformally covers the side wall and a top of the first side wall covering layer 140, the bottom of the first trench 136, a top of the barrier layer 150 and the side walls of the barrier layer 150 on two sides in the first direction (shown as the X direction in FIG. 12), and the top of the mask material layer 130.

The second side wall covering material layer 165 provides a process basis for the subsequently formed second side wall covering layer.

In some implementations, an atomic layer deposition process is adopted to form the second side wall covering material layer 165. The atomic layer deposition process is layer-by-layer deposition of single atomic layers to form a film, and is generally used for controlled film growth on an atom scale. The process has strong void filling capacity and step coverage, and is beneficial to improve the formation quality and thickness uniformity of the second side wall covering material layer 165, so that the second side wall covering material layer 165 can well cover corners at the bottom of the first trench 136, and it is easy to control a thickness of the second side wall covering material layer 165.

Figure 16:
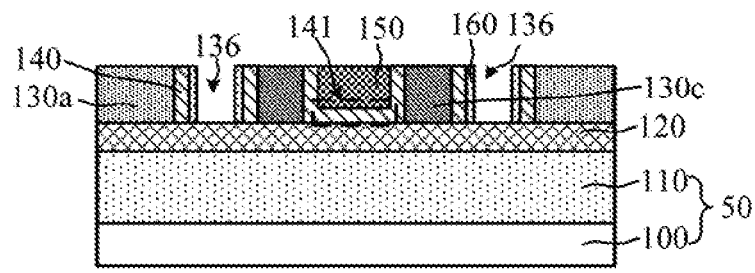
Figure 17:
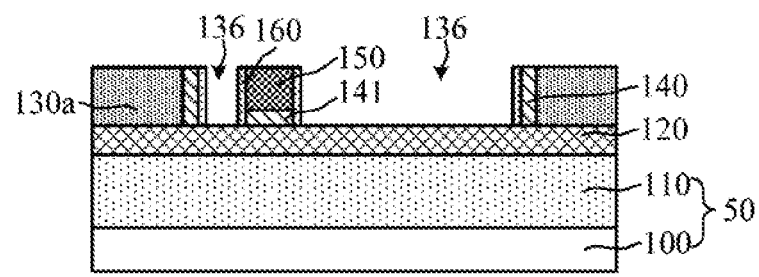

With reference to FIG. 15 to FIG. 17 together, FIG. 15 is a top view, FIG. 16 is a cross-sectional view of FIG. 15 taken along line CC1, and FIG. 17 is a cross-sectional view of FIG. 15 taken along line DD1. The second side wall covering material layer 165 on the top of the barrier layer 150, on the top of the first side wall covering layer 140, on the top of the mask material layer 130 and at the bottom of the first trench 136 are removed; and the second side wall covering material layer 165 on the side wall of the first side wall covering layer 140 and on the side wall of the barrier layer 150 is retained as the second side wall covering layer 160.

In some implementations, the maskless etching process is adopted to etch the side wall covering material layer 165. Specifically, the maskless etching process is anisotropic dry etching, so that the side wall covering material layer 165 can be etched along a direction perpendicular to the surface of the base 50. Thus, the second side wall covering material layer 165 on the top of the barrier layer 150, the top of the first side wall covering layer 140, the top of the mask material layer 130 and the bottom of the first trench 136 is removed, and the second side wall covering material layer 165 on the side wall of the first side wall covering layer 140 and the side wall of the barrier layer 150 is retained. The second side wall covering layer 160 is formed by adopting the maskless etching process, so a width range of the second side wall covering layer 160 is not influenced by the photolithography process. Therefore, a width of the second side wall covering layer 160 can be made very small, and the second side wall covering layer 160 still has good position precision and appearance precision, thereby avoiding the problem of alignment errors caused by the existing photolithography process.

It should be noted that during the formation of the first side wall covering layer 140, in the step of etching back the first side wall covering material layer 145 until the top surface of the mask material layer 130 and the bottom surface of the first trench 136 are exposed, the first side wall covering material layer 145 on the bottom of the barrier layer 150 is retained as the bottom remaining layer 141. Therefore, after the second side wall covering layer 160 is formed, the second side wall covering layer 160 also covers side walls of the bottom remaining layer 141 on two sides in the first direction.

Figure 18:
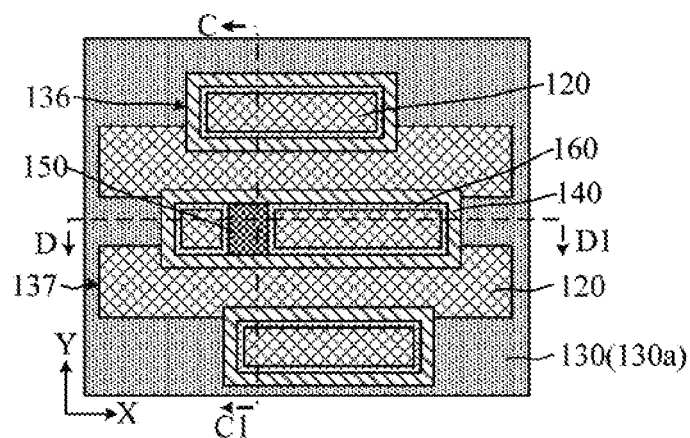
Figure 19:
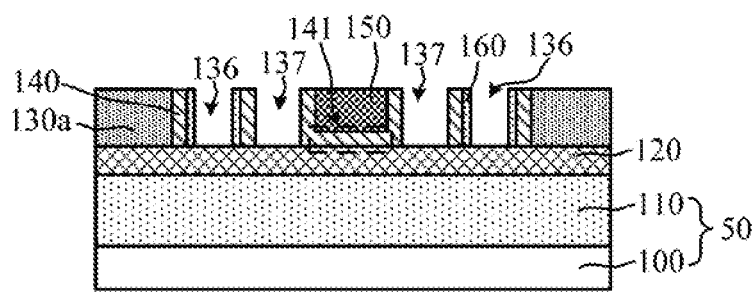
Figure 20:
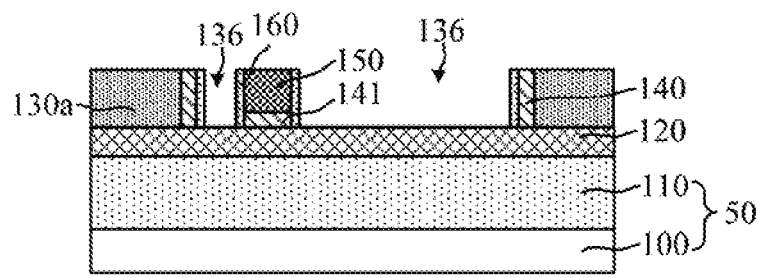

With reference to FIG. 18 to FIG. 20 together, FIG. 18 is a top view based on FIG. 15, FIG. 19 is a cross-sectional view of FIG. 18 taken along line CC1, and FIG. 20 is a cross-sectional view of FIG. 18 taken along line DD1. The mask material layer 130 between the adjacent first trenches 136 is etched by using the first side wall covering layer 140, the second side wall covering layer 160 and the barrier layer 150 as a mask to form a second trench 137 penetrating the mask material layer 130 in the mask material layer 130. The second trench 137 is isolated from the first trench 136 by the first side wall covering layer 140.

The second trenches 137 are configured to define positions, shapes and sizes of interconnection openings subsequently formed in the dielectric layer 110. Compared with the solution of forming the first trench and the second trench in the same step, in some implementations, the first trench 136 and the second trench 137 are separately formed, which is beneficial to improve the process window for forming the first trench 136 and the second trench 137 (for example, improve the optical proximity effect or alleviate the limit of the resolution of the photolithography process), so that the pattern accuracy of the first trench 136 and the second trench 137 are ensured, thereby improving the accuracy of pattern transfer.

Figure 21:
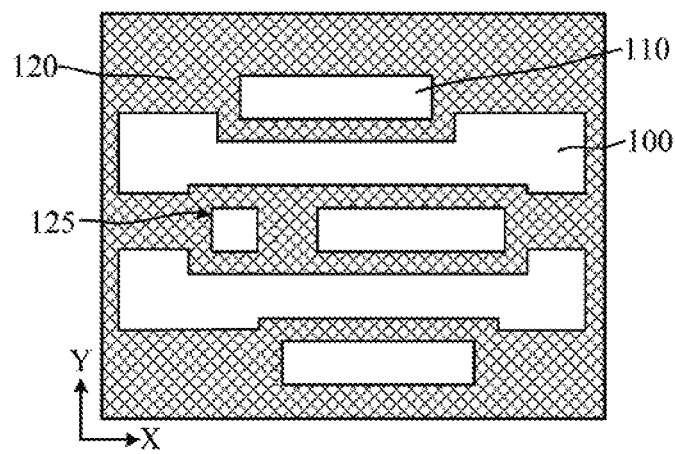

In some implementations, the mask material layer 130 between the adjacent first trenches 136 is etched. That is, the sacrificial mask layer 130c between the adjacent first trenches 136 is etched off. An etching rate of the sacrificial mask layer 130c is greater than an etching rate of the second side wall covering layer 160, so that the second side wall covering layer 160 has a protective effect on the side wall of the barrier layer 150. Specifically, the sacrificial mask layer 130*c* is etched off by using the first side wall covering layer 140, the second side wall covering layer 160 and the barrier layer 150 as the mask (as shown in FIG. 21), thereby forming the second trench 137 penetrating the mask material layer 130 in the mask material layer 130.

In some implementations, the etching resistance of the doped mask layer 130*a* is greater than the etching resistance of the sacrificial mask layer 130*c*, and therefore, the sacrificial mask layer 130*c* and the doped mask layer 130*a* have a larger etch selectivity, which significantly improves the process window for forming the second trench 137. In some implementations, the maskless etching process is adopted to etch the sacrificial mask layer 130*c*, and therefore, the forming process of the second trench 137 is not influenced by the photolithography process.

In some implementations, a wet etching process is adopted to etch the sacrificial mask layer 130*c* between the adjacent first trenches 136 by using the first side wall covering layer 140, the second side wall covering layer 160 and the barrier layer 150 the mask, thereby forming the second trench 137. The wet etching process is to remove the sacrificial mask layer 130*c* by chemical reactions, which is beneficial to reduce the damage to the base 50 exposed by the first trench 136. Moreover, by adopting the wet etching process, it is easy to achieve a higher etch selectivity between the sacrificial mask layer 130*c* and the doped mask layer 130*a*.

The first side wall covering layer 140 is formed on the side wall of the first trench 136, and therefore, after the sacrificial mask layer 130*c* is removed, the first side wall covering layer 140 achieves the isolation between the second trench 137 and the first trench 136.

It should also be noted that, as an example, after the second trenches 137 are formed, the second side wall covering layers 160 in all the first trenches 136 are retained.

In some implementations, after forming the second trench 137, the forming method further includes that:

With reference to FIG. 21, FIG. 21 is a top view based on FIG. 18. The dielectric layer 110 (as shown in FIG. 20) on bottoms of the first trench 136 (as shown in FIG. 18) and the second trench 137 (as shown in FIG. 18) are etched by using the first side wall covering layer 140 (as shown in FIG. 18), the second side wall covering layer 160 (as shown in FIG. 18), the barrier layer 150 (as shown in FIG. 18) and the mask material layer 130 (as shown in FIG. 18) as a mask to form interconnection openings 125 in the dielectric layer 110.

Patterns of the first trench 136 and the second trench 137 are transferred into the base 50 to form the interconnection openings 125 in the dielectric layer 110. As can be known from the foregoing analysis, by forming the second side wall covering layer 160, the appearance and size of the barrier layer 150 are ensured, which accordingly improves the pattern accuracy of the interconnection opening 125. Specifically, the interconnection opening 125 exposes a surface of a conductive structure (not shown).

An etch stop layer 120 is also formed on the dielectric layer 110, and therefore, before the dielectric layer 110 is etched, the etch stop layer 120 is also etched.

In some implementations, after forming the interconnection opening 125, the method further includes: removing the first side wall covering layer 140, the second side wall covering layer 160, the barrier layer 150 and the mask material layer 130.

Figure 22:
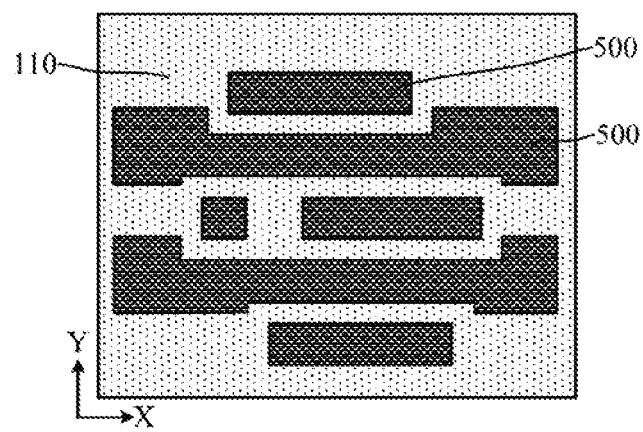

With reference to FIG. 22, FIG. 22 is a top view based on FIG. 21. The interconnection opening 125 (as shown in FIG. 21) is filled with an interconnection conductive structure 500.

The interconnection opening 125 has higher pattern accuracy, so that the profile and layout of the interconnection conductive structure 500 meet the design requirements, and are beneficial to improve the performance of the interconnection conductive structure 500. In some implementations, the interconnection conductive structure 500 is a metal interconnection line in the BEOL process, and the interconnection conductive structure 500 and the conductive structure (not shown) are electrically connected. The manufacturing process of forming the interconnection conductive structure 500 generally includes a step of planarizing a conductive material. The etch stop layer 120 is removed during the planarization.

Another form of the present disclosure further provides a semiconductor structure. With reference to FIG. 15 to FIG. 17 together, a schematic structural diagram of one form of the semiconductor structure according to the present disclosure is shown. FIG. 15 is a top view, FIG. 16 is a cross-sectional view of FIG. 15 taken along line CC1, and FIG. 17 is a cross-sectional view of FIG. 15 taken along line DD1.

The semiconductor structure includes: a base 50; a mask material layer 130, located on the base 50; a plurality of first trenches 136 disposed at intervals, where the first trenches 136 penetrate the mask material layer 130, an extension direction of the first trenches 136 is a first direction (shown as an X direction in FIG. 15), a direction perpendicular to the first direction is a second direction (shown as a Y direction in FIG. 15), and the plurality of first trenches 136 are arranged in parallel along the second direction; a first side wall covering layer 140, located on a side wall of the first trench 136; a barrier layer 150, located in at least one of the first trenches 136, where the barrier layer 150 divides the first trench 136 in the first direction; and a second side wall covering layer 160, located on surfaces of side walls of the first side wall covering layer 136 on two sides in the first direction.

In some implementations, the base 50 includes a substrate 100 and a dielectric layer 110 located on the substrate 100. A plurality of conductive structures (not shown) are formed in the substrate 100. A material of the dielectric layer 110 is a low-k dielectric material, an ultra-low-k dielectric material, silicon oxide, silicon nitride, silicon oxynitride or the like.

The mask material layer 130 is used as a mandrel layer, thereby providing a process basis for subsequent pattern transfer.

In some implementations, the mask material layer 130 in partial regions has doping ions, and the doping ions are suitable for increasing etching resistance of the mask material layer 130. Specifically, the mask material layer 130 doped with ions is used as a doped mask layer 130*a*, the mask material layer 130 not doped with ions is used as a sacrificial mask layer 130*c*, and the sacrificial mask layer 130*c* extends along the first direction. In some implementations, a material of the doped mask layer 130*a* is amorphous silicon doped with doping ions, and a material of the sacrificial mask layer 130*c* is amorphous silicon.

The subsequent manufacturing process further includes: etching the mask material layer 130 between the adjacent first trenches 136 to form a second trench. The sacrificial mask layer 130*c* is configured to define a formation position of the second trench subsequently. Etching resistance of the doped mask layer 130*a* is greater than etching resistance of the sacrificial mask layer 130c, and therefore, in the subsequent etching process of forming the second trench, the sacrificial mask layer 130c and the doped mask layer 130a have a larger etch selectivity, which significantly improves a process window for forming the second trench (for example, a maskless etching manner may be adopted to remove the sacrificial mask layer 130c) and ensures the pattern accuracy of the second trench.

In some implementations, the doping ions are B ions, and the material of the doped mask layer 130a accordingly is changed to boron-doped silicon, thereby improving the etch selectivity between the sacrificial mask layer 130c and the doped mask layer 130a. Moreover, the B atoms have higher stability, so that the thermal stability and chemical stability of the doped mask layer 130a are ensured.

In some implementations, by reasonably setting a concentration of the doping ions in the doped mask layer 130a, the etch selectivity between the sacrificial mask layer 130c and the doped mask layer 130a satisfies the process requirements, thereby ensuring the appearance quality of the second trench subsequently.

The first trenches 136 are configured to define positions, shapes and sizes of interconnection openings subsequently formed in the dielectric layer 110. In some implementations, the first trenches 136 are located on two sides of the sacrificial mask layer 130c in the second direction, and projections of the first trench 136 and the sacrificial mask layer 130c on the base 50 are adjacent or partially overlap.

The projections of the first trench 136 and the sacrificial mask layer 130c on the base 50 are adjacent or partially overlap, thereby reducing a distance between the first trench 136 and the second trench adjacent to each other, and satisfying the design complexity requirements of the integrated circuit.

The second trench is isolated from the first trench 136 through the first side wall covering layer 140, so that the problem of communication between the second trench and the first trench 136 is avoided, and moreover, the distance between the second trench and the first trench 136 adjacent to each other can satisfy the designed minimum space. Therefore, a material of the first side wall covering layer 140 is made of a material different from that of the mask material layer 130, and thus, functions as an etching mask. In some implementations the material of the first side wall covering layer 140 is a metal oxide. The metal oxide has higher etching resistance, and has a higher etch selectivity with the mask material layer 130. Specifically, the metal oxide includes at least one of titanium oxide, tantalum oxide, tungsten oxide, cobalt oxide, chromium oxide, vanadium oxide, cadmium oxide, hafnium oxide, indium oxide, iron oxide, aluminum oxide, zirconium oxide, zinc oxide and nickel oxide.

In some implementations, a width of the first side wall covering layer 140 is 100 Å to 300 Å, for example, 150 Å, 200 Å or 250 Å. The width of the first side wall covering layer 140 refers to a size of the first side wall covering layer 140 in a direction perpendicular to the side wall of the barrier layer 150.

It should be noted that the manufacturing process of forming the first side wall covering layer 140 generally includes a step of forming a first side wall covering material layer on the side wall and a bottom of the first trench 136 and a top of the mask material layer 130, and further includes a step of etching the first side wall covering material layer. During the formation of the semiconductor structure, the barrier layer 150 is formed before the first side wall covering material layer is etched, and therefore, the semiconductor structure further includes: a bottom remaining layer 141 located on a bottom of the barrier layer 150. The bottom remaining layer 141 is retained when the first side wall covering material layer is etched.

The barrier layer 150 is used as a cut feature of the first trench 136. When a pattern of the first trench 136 is transferred into the base 50 subsequently, the barrier layer 150 functions as an etching mask, so that isolated patterns are formed in the base 50. Compared with the solution of cutting the first trench 136 in its extension direction by a photolithography process, the process window for forming the first trench 136 is enlarged through the barrier layer 150, so that the accuracy of pattern transfer is improved. In some implementations, for the material of the barrier layer 150, reference is made to the foregoing In some implementations, a width of the barrier layer 150 in the first direction is 20 nm to 40 nm.

The second side wall covering layer 160 is configured to protect the side wall of the barrier layer 150, to reduce the loss of the side wall of the barrier layer 150 caused by the etching process adopted to form the second trench and accordingly reduce the influence on a size of the barrier layer 150 along the first direction (shown as the X direction in FIG. 15) and the appearance of the barrier layer 150. Therefore, when the pattern of the first trench 136 is transferred into the base 50 subsequently, it is beneficial to improve the accuracy of pattern transfer. In addition, when the mask material layer 130 between the adjacent first trenches 136 is etched subsequently, the second side wall covering layer 160 may also function as an etching mask. Therefore, a material of the second side wall covering layer 160 is different from the material of the mask material layer 130. The material of the second side wall covering layer 160 may be silicon nitride, silicon oxide, silicon oxynitride or silicon carbide. The amorphous silicon has a higher etch selectivity to the above materials.

In some implementations, the material of the second side wall covering layer 160 is different from the material of the first side wall covering layer 140. According to the process requirements, when the pattern in the first trench 136 is transferred into the base 50 subsequently, the first side wall covering layer 140 and the second side wall covering layer 160 in part of the first trenches 136 are jointly used as a mask, and the first side wall covering layer 140 in part of the first trenches 136 is independently used as a mask. That is, before the pattern in the first trench 136 is transferred into the base 50, for the first trench without a barrier layer, a step of removing the second side wall covering layer 160 in the first trench 136 may further be included. Therefore, by making the material of the second side wall covering layer 160 different from the material of the first side wall covering layer 140, the process flexibility is improved, thereby facilitating the removal of the second side wall covering layer 160.

In some implementations, the material of the first side wall covering layer 140 is a metal oxide, and the material of the second side wall covering layer 160 is silicon nitride. The metal oxide and the silicon nitride have a higher etch selectivity. In other implementations, the materials of the first side wall covering layer and the second side wall covering layer may also be the same.

In some implementations, a width of the second side wall covering layer 160 is 50 Å to 1000 Å, for example, 100 Å, 400 Å, 500 Å or 600 Å.

It should also be noted that the semiconductor structure further includes a bottom remaining layer 141 located on the bottom of the barrier layer 150. Therefore, the second side wall covering layer 160 also covers side walls of the bottom remaining layer 141 on two sides in the first direction.

In addition, an etch stop layer 120 is also formed between the base 50 and the mask material layer 130. The etch stop layer 120 is configured to protect the base 50, thereby reducing the damage to the surface of the base 50 caused by manufacturing processes before etching the base 50. In some implementations, the etch stop layer 120 is located between the dielectric layer 110 and the mask material layer 130.

A material of the etch stop layer 120 is different from the material of the mask material layer 130. In some implementations, the material of the etch stop layer 120 is a metal nitride such as TiN, AlN, TaN or the like.

The semiconductor structure in some implementations may be formed by adopting the forming methods described in the foregoing implementations, or may be formed by adopting other forming methods. For a detailed description of the semiconductor structure of some implementations, reference may be made to the corresponding description in the foregoing implementations, and details will not be repeated here in some implementations.

Although the present disclosure has been disclosed above, the present disclosure is not limited thereto. A person skilled in the art may make variations and modifications without departing from the spirit and scope of the present disclosure. Therefore, the protection scope of the present disclosure should be subject to the appended claims.

What is claimed is:

1. A method for forming a semiconductor structure, comprising:
    providing a base, wherein a mask material layer is formed on the base, a plurality of first trenches is formed in the mask material layer, the first trenches disposed at intervals and penetrating the mask material layer, and where an extension direction of the first trench is a first direction, the plurality of first trenches are arranged in parallel along a second direction, and the second direction is perpendicular to the first direction;
    forming a first side wall covering layer and a barrier layer, wherein the first side wall covering layer is located on a side wall of a first trench of the plurality of first trenches, the barrier layer is located in at least the first trench of the plurality of first trenches, the barrier layer divides the first trench of the plurality of first trenches in the first direction, and the first side wall covering layer exposes side walls of the barrier layer on two sides in the first direction;
    forming a second side wall covering layer on the side walls of the barrier layer exposed by the first side wall covering layer; and
    etching the mask material layer between the first trench and another adjacent first trench of the plurality of first trenches using the first side wall covering layer, the second side wall covering layer and the barrier layer as a mask to form a second trench penetrating the mask material layer, wherein the second trench is isolated from the first trench by the first side wall covering layer.

2. The method for forming a semiconductor structure according to claim 1, wherein the step of forming the second side wall covering layer comprises:
    forming a second side wall covering material layer, wherein the second side wall covering material layer conformally covers a side wall and a top of the first side wall covering layer, a bottom of the first trench, a top of the barrier layer and side walls of the barrier layer on two sides in the first direction, and a top of the mask material layer; and
    removing the second side wall covering material layer on the top of the barrier layer, the top of the first side wall covering layer, the top of the mask material layer and the bottom of the first trench, and retaining the second side wall covering material layer on the side wall of the first side wall covering layer and the side walls of the barrier layer as the second side wall covering layer.

3. The method for forming a semiconductor structure according to claim 2, wherein an atomic layer deposition process is adopted to form the second side wall covering material layer.

4. The method for forming a semiconductor structure according to claim 2, wherein an anisotropic dry etching process is adopted to remove the second side wall covering material layer on the top of the barrier layer, the top of the mask material layer and the bottom of the first trench.

5. The method for forming a semiconductor structure according to claim 1, wherein a material of the second side wall covering layer is different from a material of the first side wall covering layer.

6. The method for forming a semiconductor structure according to claim 1, wherein:
    the material of the first side wall covering layer is a metal oxide; and
    the material of the second side wall covering layer is silicon nitride, silicon oxide, silicon oxynitride or silicon carbide.

7. The method for forming a semiconductor structure according to claim 1, wherein:
    before forming the first trench of the plurality of first trenches, the method further comprises: performing doping treatment on the mask material layer in partial regions, which are suitable for increasing etching resistance of the mask material layer subjected to the doping treatment, wherein the mask material layer not subjected to the doping treatment is used as a sacrificial mask layer, and the sacrificial mask layer extends along the first direction;
    after the doping treatment, the first trench of the plurality of first trenches is formed in the mask material layer on two sides of the sacrificial mask layer in the second direction, wherein the side wall of the first trench exposes the sacrificial mask layer; and
    the step of etching the mask material layer between the first trench and another adjacent first trench of the plurality of first trenches using the first side wall covering layer, the second side wall covering layer and the barrier layer as a mask comprises: etching off the sacrificial mask layer using the first side wall covering layer, the second side wall covering layer and the barrier layer as the mask.

8. The forming method of a semiconductor structure according to claim 7, wherein in the step of forming the mask material layer, a material of the mask material layer is amorphous silicon; and
    in the step of performing the doping treatment, doping ions for the doping treatment comprise B ions.

9. The method for forming a semiconductor structure according to claim 1, wherein a wet etching process is adopted to etch the mask material layer between the first trench and another adjacent first trench of the plurality of first trenches using the first side wall covering layer, the second side wall covering layer and the barrier layer as the mask to form the second trench.

10. The method for forming a semiconductor structure according to claim 1, wherein the step of forming the first side wall covering layer and the barrier layer comprises:
forming a first side wall covering material layer on the side wall and a bottom of the first trench and a top of the mask material layer;
after forming the first side wall covering material layer, forming the barrier layer in at least the first trench of the plurality of first trenches, wherein side walls of the barrier layer on two sides in the second direction and a bottom surface of the barrier layer are respectively in contact with the first side wall covering material layer; and
etching back the first side wall covering material layer until a top surface of the mask material layer and a bottom surface of the first trench are exposed so as to form a first side wall covering.

11. The method for forming a semiconductor structure according to claim 10, wherein the step of forming the barrier layer comprises:
forming a filling layer on the mask material layer and the first side wall covering material layer, wherein the filling layer is also filled into the first trench;
forming a through slot in the filling layer, wherein the through slot divides the filling layer in the first trench in the first direction, and extends onto the mask material layer along the second direction;
forming a barrier material layer in the through slot, wherein the barrier material layer also covers a top surface of the filling layer;
etching back the barrier material layer, and retaining the barrier material layer in the through slot as the barrier layer; and
after etching back the barrier material layer, removing the filling layer.

12. The method for forming a semiconductor structure according to claim 10, wherein:
in the step of etching back the first side wall covering material layer until a top surface of the mask material layer and a bottom surface of the first trench are exposed, the first side wall covering material layer on a bottom of the barrier layer is used as a bottom remaining layer; and
after forming the second side wall covering layer, the second side wall covering layer also covers side walls of the bottom remaining layer on two sides in the first direction.

13. The method for forming a semiconductor structure according to claim 1, wherein a material of the barrier layer is silicon oxide, low temperature oxide, silicon oxycarbide or titanium oxide.

14. The method for forming a semiconductor structure according to claim 1, wherein:
the base comprises a substrate and a dielectric layer located on the substrate; and
the method further comprises:
after forming the second trench, etching the dielectric layer on bottoms of the first trench and the second trench using the first side wall covering layer, the second side wall covering layer, the barrier layer and the mask material layer as a mask to form interconnection openings; and
filling the interconnection openings with an interconnection conductive structure.

15. The method for forming a semiconductor structure according to claim 1, wherein a width of the second side wall covering layer is 50 Å to 1000 Å, and a width of the first side wall covering layer is 100 Å to 300 Å.

16. The method for forming a semiconductor structure according to claim 1, wherein a width of the barrier layer in the first direction is 20 nm to 40 nm.

* * * * *